US012770841B2

(12) United States Patent
Usami et al.

(10) Patent No.: US 12,770,841 B2
(45) Date of Patent: Oct. 20, 2026

(54) WAFER PLACEMENT TABLE

(71) Applicant: NGK INSULATORS, LTD., Nagoya-City (JP)

(72) Inventors: Taro Usami, Kasamatsu-Town (JP); Yohei Kajiura, Nagoya-City (JP)

(73) Assignee: NGK INSULATORS, LTD., Nagoya (JP)

( * ) Notice: Subject to any disclaimer, the term of this patent is extended or adjusted under 35 U.S.C. 154(b) by 315 days.

(21) Appl. No.: 18/441,111

(22) Filed: Feb. 14, 2024

(65) Prior Publication Data

US 2024/0395511 A1 Nov. 28, 2024

Related U.S. Application Data

(63) Continuation of application No. PCT/JP2023/019273, filed on May 24, 2023.

(51) Int. Cl.
*H01J 37/32* (2006.01)

(52) U.S. Cl.
CPC .. *H01J 37/32724* (2013.01); *H01J 37/32642* (2013.01)

(58) Field of Classification Search
CPC .... H10P 72/72; H10P 72/722; H10P 72/0602; H10W 72/07188; H10W 40/50; H10D 89/60
USPC .......................................................... 414/787
See application file for complete search history.

(56) References Cited

U.S. PATENT DOCUMENTS 6,740,853 B1 * 5/2004 Johnson .............. C23C 16/4586 219/443.1
8,426,764 B2 * 4/2013 Tandou ............. H01J 37/32623 118/724
12,131,890 B2 * 10/2024 Erickson ........... H01J 37/32642
12,211,671 B2 * 1/2025 Kuno ................ H01J 37/32724
2009/0277883 A1 11/2009 Tandou et al.
2010/0126666 A1 5/2010 Tandou et al.

(Continued)

FOREIGN PATENT DOCUMENTS

JP 2009-272535 A 11/2009
JP 2010-129766 A 6/2010

(Continued)

OTHER PUBLICATIONS https://ko.wikipedia.org/wiki/%ED%83%80%EC%9D%B4%ED%83%80%EB%8A%84.

(Continued)

*Primary Examiner* — Terrell H Matthews

(74) *Attorney, Agent, or Firm* — Muncy, Geissler, Olds & Lowe, P.C.

(57) ABSTRACT

A wafer placement table includes a ceramic plate having a wafer placement surface on an upper surface, and a cooling plate provided on a lower surface of the ceramic plate. The cooling plate is made of a material having a lower thermal conductivity than Al. A length between an upper surface of a refrigerant flow path and the wafer placement surface is not constant and varies as being long in one part and short in another part. A flow-path cross-sectional area of the refrigerant flow path is not constant and varies as being small in one part and large in another part. An aspect ratio defined as a ratio of a vertical length to a horizontal length of a flow-path cross section of the refrigerant flow path is not constant and varies as being small in one part and large in another part.

8 Claims, 5 Drawing Sheets

(56) References Cited

U.S. PATENT DOCUMENTS

| | | | | |
|---|---|---|---|---|
| 2010/0326957 | A1 | 12/2010 | Maeda et al. | |
| 2015/0153116 | A1* | 6/2015 | Sekiguchi | F28F 13/06 165/172 |
| 2020/0251371 | A1 | 8/2020 | Kuno et al. | |
| 2020/0303230 | A1* | 9/2020 | Sonoda | H02N 13/00 |
| 2021/0043476 | A1 | 2/2021 | Koizumi et al. | |
| 2022/0139681 | A1 | 5/2022 | Erickson et al. | |
| 2023/0146001 | A1* | 5/2023 | Kuno | H01J 37/32642 414/271 |
| 2024/0408712 | A1* | 12/2024 | Schmid | B23Q 11/10 |

FOREIGN PATENT DOCUMENTS

| | | | | |
|---|---|---|---|---|
| JP | 6175437 | B2 | 8/2017 | |
| JP | 2021-028961 | A | 2/2021 | |
| JP | 2022-525028 | A | 5/2022 | |
| JP | 2023-044704 | A | 3/2023 | |
| KR | 10-2010-0138687 | A | 12/2010 | |
| KR | 10-2020-0052973 | A | 5/2020 | |
| WO | 2014/017661 | A1 | 1/2014 | |
| WO | WO-2016197083 | A1 * | 12/2016 | H10P 72/00 |

OTHER PUBLICATIONS

Korean Office Action (with English translation) dated Jan. 7, 2025 (Application No. 10-2024-7005381).
International Search Report and Written Opinion (Application No. PCT/JP2023/019273) dated Aug. 15, 2023 (7 pages).
English translation of the International Preliminary Report on Patentability (Chapter I) (Application No. PCT/JP2023/019273) dated Dec. 4, 2025 (6 pages).

* cited by examiner

WAFER PLACEMENT TABLE

BACKGROUND OF THE INVENTION

1. Field of the Invention

The present invention relates to a wafer placement table.

2. Description of the Related Art

Some known arts relate to a wafer placement table including a ceramic plate having a wafer placement surface on an upper surface, a cooling plate provided on a lower surface of the ceramic plate, and a refrigerant flow path provided inside the cooling plate. In a wafer placement table disclosed by PTL 1, for example, the cooling plate is made of a material having a high thermal conductivity, such as Al. Furthermore, the distance between the upper surface of the refrigerant flow path and the wafer placement surface is constant from the inlet to the outlet of the refrigerant flow path. Furthermore, the refrigerant flow path has a cross-sectional shape that varies with the position in the refrigerant flow path. According to PTL 1, the flow path has a cross-sectional area that is smaller at a portion thereof corresponding to a portion of the wafer placement surface where the temperature is relatively high than at a portion thereof corresponding to a portion of the wafer placement surface where the temperature is relatively low. Furthermore, the width of the upper surface of the refrigerant flow path is constant from the inlet to the outlet of the refrigerant flow path. Furthermore, the length of the refrigerant flow path in the heightwise direction is shorter at a position corresponding to the portion of the wafer placement surface where the temperature is relatively high than at a position corresponding to the portion of the wafer placement surface where the temperature is relatively low.

CITATION LIST

Patent Literature

PTL 1: JP 2021-28961 A

SUMMARY OF THE INVENTION

In the configuration disclosed by PTL 1, the nonuniformity in heat removal to be achieved through the refrigerant flow path can be reduced if the cooling plate is made of a material having a favorable thermal conductivity, such as Al, but cannot be reduced satisfactorily if the cooling plate is made of a material having a lower thermal conductivity than Al.

The present invention is to solve the above problem, and a main object of the present invention is to reduce the temperature nonuniformity at a wafer placement surface of a wafer placement table including a cooling plate made of a material having a lower thermal conductivity than Al.

[1] A wafer placement table according to the present invention includes: a ceramic plate having a wafer placement surface on an upper surface; a cooling plate provided on a lower surface of the ceramic plate; and a refrigerant flow path provided inside the cooling plate, wherein the cooling plate is made of a material having a lower thermal conductivity than Al, wherein a length between an upper surface of the refrigerant flow path and the wafer placement surface is not constant and varies as being long in one part and short in another part, wherein a flow-path cross-sectional area of the refrigerant flow path is not constant and varies as being small in one part and large in another part, and wherein an aspect ratio defined as a ratio of a vertical length to a horizontal length of a flow-path cross section of the refrigerant flow path is not constant and varies as being small in one part and large in another part.

In the present wafer placement table, the length between the upper surface of the refrigerant flow path and the wafer placement surface is not constant and varies as being long in one part and short in another part. In the part where the length is short, the cooling efficiency is higher than in the part where the length is long. Furthermore, the flow-path cross-sectional area of the refrigerant flow path is not constant and varies as being small in one part and large in another part. In the part where the flow-path cross-sectional area of the refrigerant flow path is small, the flow speed is faster and the cooling efficiency is higher than in the part where the flow-path cross-sectional area is large. Furthermore, the aspect ratio of the refrigerant flow path (the ratio of the vertical length to the horizontal length of the flow-path cross section of the refrigerant flow path) is not constant and varies as being small in one part and large in another part. If the cooling plate is made of a material having a lower thermal conductivity than Al and if the refrigerant flow path has a constant cross-sectional area, the cooling efficiency becomes higher as the aspect ratio becomes smaller. The above means that, in the wafer placement table including the cooling plate made of a material having a lower thermal conductivity than Al, adjusting the length between the upper surface of the refrigerant flow path and the wafer placement surface, the flow-path cross-sectional area of the refrigerant flow path, and the aspect ratio of the flow-path cross section reduces the temperature nonuniformity at the wafer placement surface.

[2] In the wafer placement table according to the present invention (the wafer placement table according to [1] above), the cooling plate may have a thermal conductivity of 50 W/mK or lower. In such a case, if the refrigerant flow path has a constant cross-sectional area, the cooling efficiency significantly becomes higher as the aspect ratio becomes smaller.

[3] In the wafer placement table according to the present invention (the wafer placement table according to [1] or [2] above), the length between the upper surface of the refrigerant flow path and the wafer placement surface, the flow-path cross-sectional area of the refrigerant flow path, and the aspect ratio of the flow-path cross section of the refrigerant flow path may be designed such that an efficiency of heat exchange in an outer peripheral area of the wafer placement surface is higher than an efficiency of heat exchange in a central area of the wafer placement surface. In general, the input of plasma heat to the wafer placement table is greater for the outer peripheral area of the wafer placement surface than for the central area. Considering such a situation, the above design is employed, whereby the cooling efficiency in the outer peripheral area of the wafer placement surface is made higher than in the central area. Consequently, the temperature nonuniformity at the wafer placement surface is reduced effectively.

[4] In the wafer placement table according to the present invention (the wafer placement table according to [3] above), in the outer peripheral area of the wafer placement surface, the length between the upper surface of the refrigerant flow path and the wafer placement surface may be shorter, the flow-path cross-sectional area of the refrigerant flow path may be smaller, and the aspect ratio of the flow-path cross section of the refrigerant flow path may be smaller than in the central area of the wafer placement surface.

[5] In the wafer placement table according to the present invention (the wafer placement table according to [3] or [4] above), the ceramic plate may have an annular focus-ring placement surface provided around the wafer placement surface and located at a lower level than the wafer placement surface, and the focus-ring placement surface may be designed to receive an annular focus ring whose outside diameter is greater than an outside diameter of the ceramic plate and an outside diameter of the cooling plate. In such a case, the focus ring extends outward beyond (overhangs) the wafer placement table. Therefore, the outer peripheral area of the wafer placement surface is more likely to have a high temperature. Hence, the application of the present invention provides a great significance.

[6] In the wafer placement table according to the present invention (the wafer placement table according to any of [1] to [5] above), a part of the refrigerant flow path where the aspect ratio is small may have an aspect ratio of 0.5 or smaller. Such a design further increases the cooling efficiency exerted in the part of the refrigerant flow path where the aspect ratio is small.

[7] In the wafer placement table according to the present invention (the wafer placement table according to [6] above), a part of the refrigerant flow path where the aspect ratio is large may have an aspect ratio of 1 or greater. Such a design increases the difference in the cooling efficiency between the part of the refrigerant flow path where the aspect ratio is small and the part of the refrigerant flow path where the aspect ratio is large.

[8] In the wafer placement table according to the present invention (the wafer placement table according to any of [1] to [7] above), the ceramic plate may be made of alumina, and the cooling plate may be made of Ti or a Ti alloy. The difference in thermal expansion between the ceramic plate and the cooling plate made of the above materials is small. Therefore, the warpage of the wafer placement table is reduced.

[9] In the wafer placement table according to the present invention (the wafer placement table according to any of [1] to [8] above), the wafer placement surface includes a high-cooling-need area and a low-cooling-need area; and the length between the upper surface of the refrigerant flow path and the wafer placement surface, the flow-path cross-sectional area of the refrigerant flow path, and the aspect ratio of the flow-path cross section of the refrigerant flow path may be designed such that an efficiency of heat exchange at the wafer placement surface is higher in the high-cooling-need area than in the low-cooling-need area. For example, the high-cooling-need area is the outer peripheral area of the wafer placement surface, and the low-cooling-need area is the central area of the wafer placement surface.

DETAILED DESCRIPTION OF THE INVENTION

Figure 1:
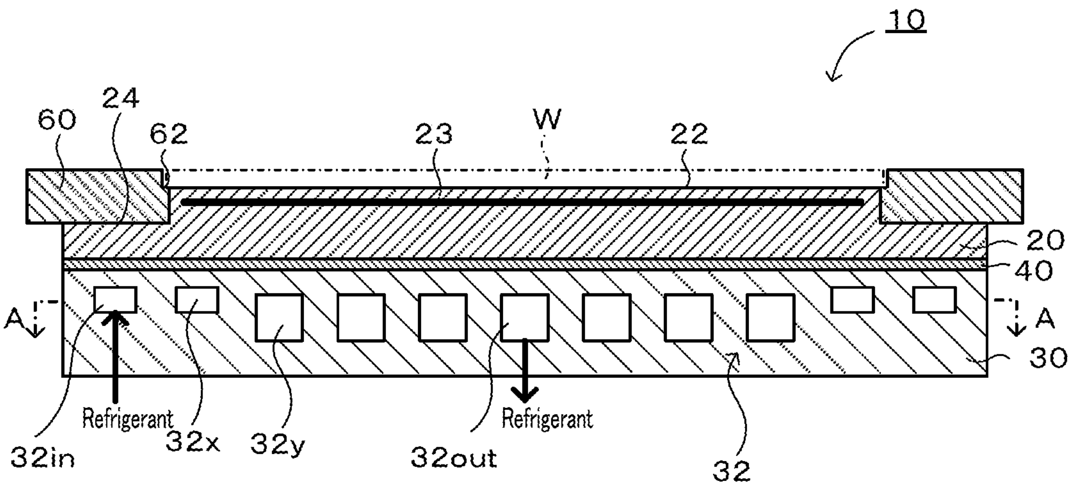
FIG. 1 is a sectional view of a wafer placement table 10.
Figure 2:
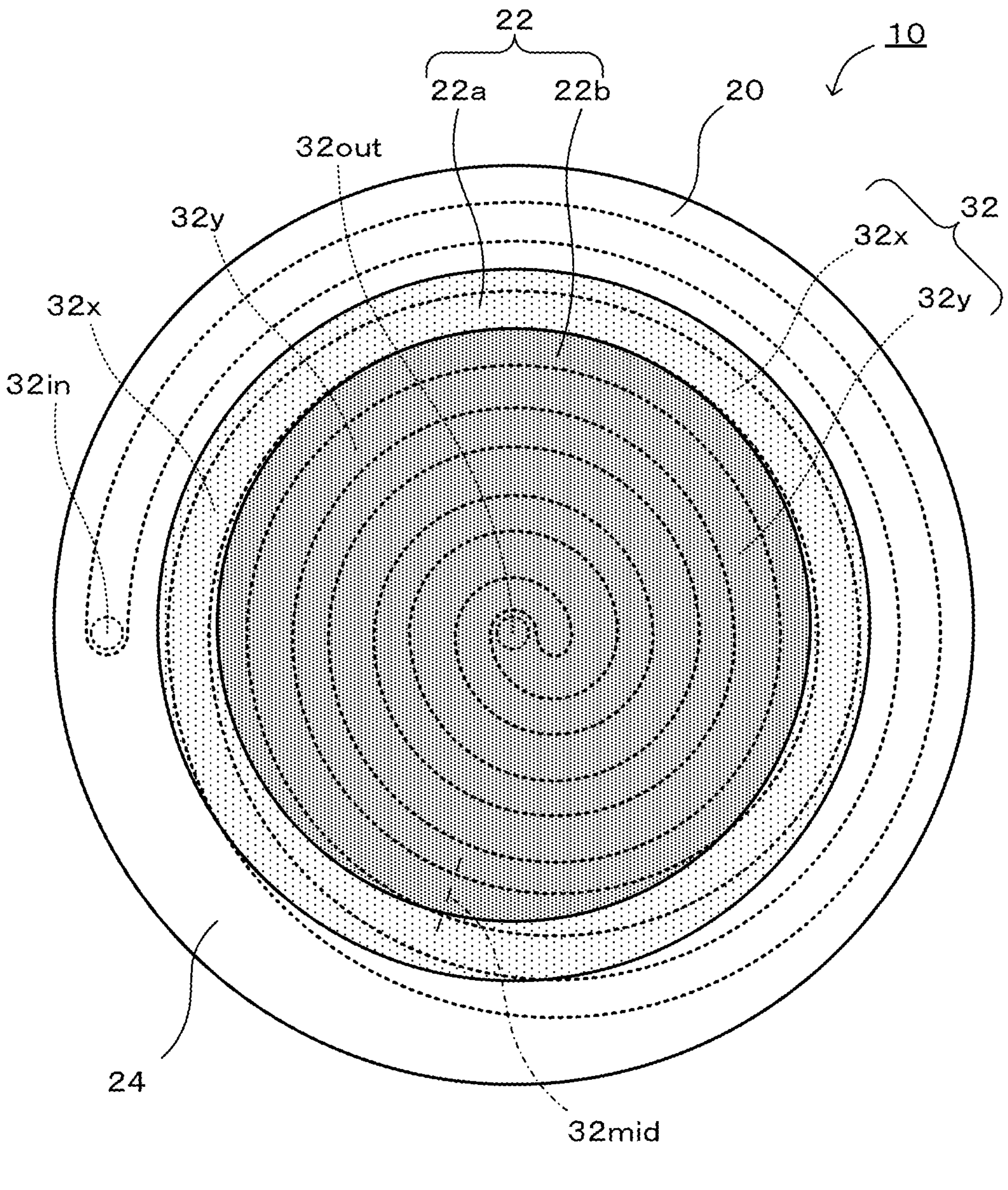
FIG. 2 is a plan view of the wafer placement table 10.
Figure 3:
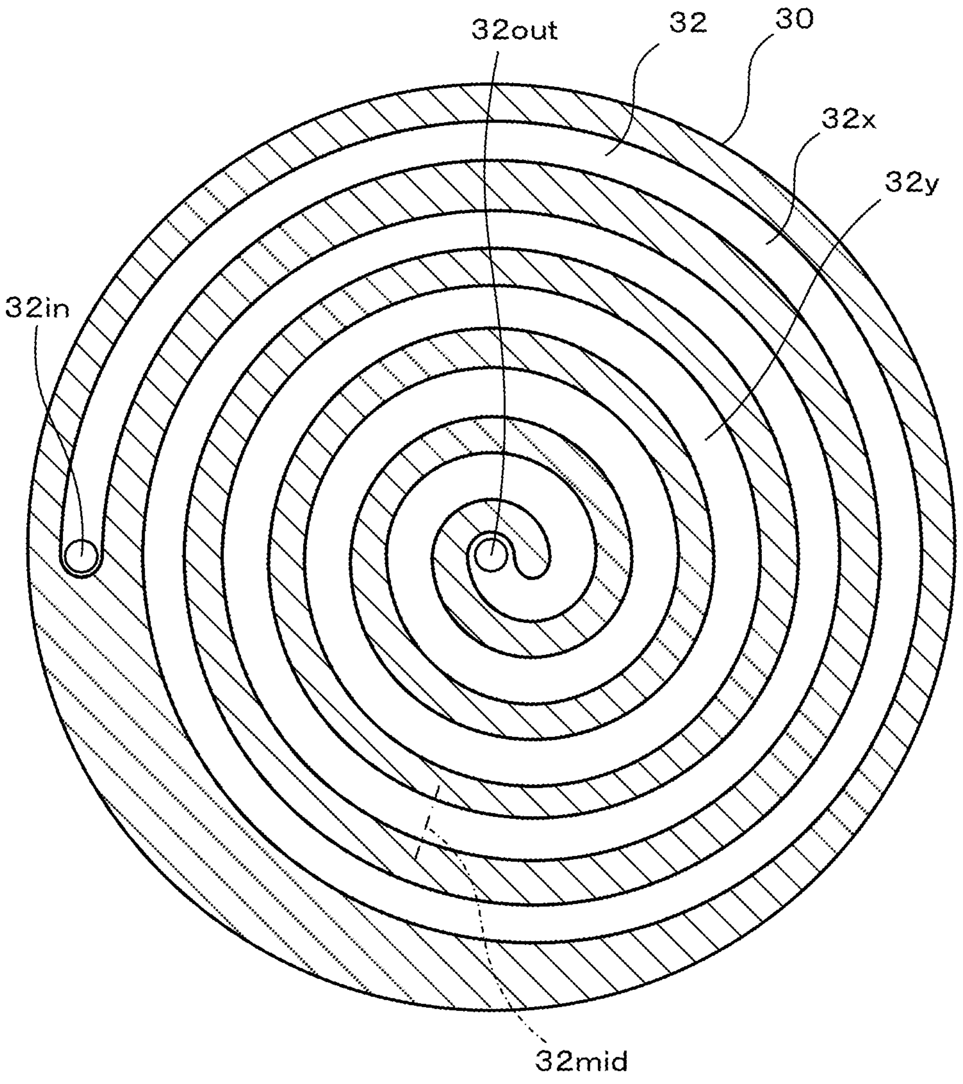
FIG. 3 illustrates a section taken along line A-A given in FIG. 1.
Figure 4:
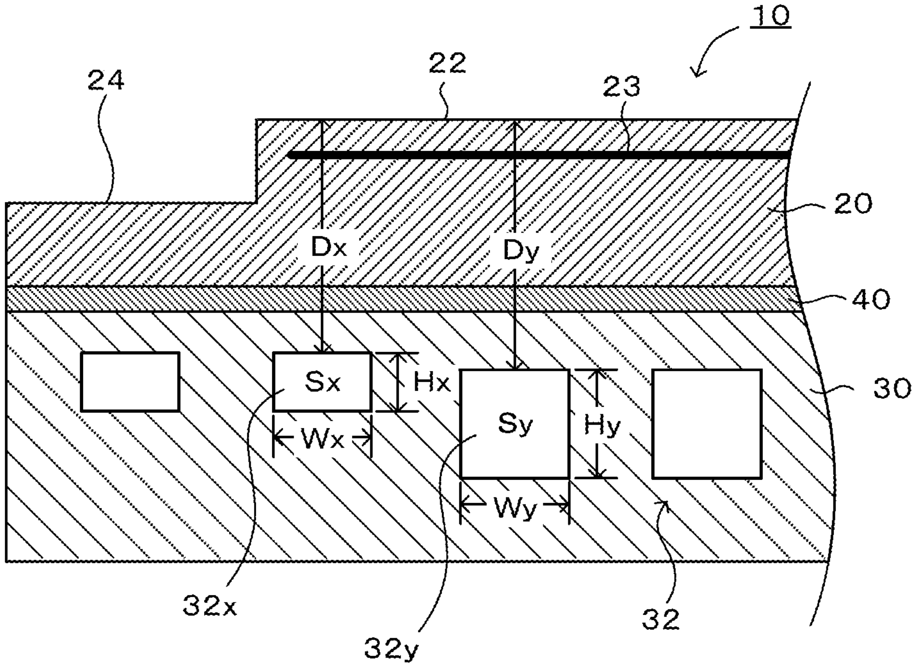
FIG. 4 is an enlargement of a part illustrated in FIG. 1.

A preferable embodiment of the present invention will now be described with reference to the drawings. FIG. 1 is a sectional view of a wafer placement table 10 (a sectional view of the wafer placement table 10 that is taken along a plane containing the center axis of the wafer placement table 10). FIG. 2 is a plan view of the wafer placement table 10. FIG. 3 illustrates a section taken along line A-A given in FIG. 1. FIG. 4 is an enlargement of a part illustrated in FIG. 1.

The wafer placement table 10 is intended to perform CVD, etching, or the like on a wafer W by using plasma. The wafer placement table 10 includes a ceramic plate 20, a cooling plate 30, and a joining layer 40.

The ceramic plate 20 is made of a ceramic material represented by alumina, aluminum nitride, or the like. The ceramic plate 20 has a wafer placement surface 22, an electrostatic electrode 23, and a focus-ring placement surface 24. Hereinafter, focus ring may be abbreviated to "FR".

The wafer placement surface 22 is a circular surface and forms an upper surface of the ceramic plate 20. The wafer W is to be placed on the wafer placement surface 22. The wafer placement surface 22 is provided with an annular seal band, which is not illustrated, along the outer edge thereof. The area surrounded by the seal band has a plurality of round small projections provided over the entirety of the area. The seal band and the round small projections are of the same height, which is several μm to several 10 s of μm, for example. The wafer placement surface 22 includes an area that tends to have a high temperature (a high-cooling-need area) and an area that does not tends to have a high temperature (a low-cooling-need area). In the present embodiment, the input of plasma heat with which the wafer W is to be processed is greater on the outer peripheral side. Accordingly, in the wafer placement surface 22, as illustrated in FIG. 2, an outer peripheral area 22*a* (the area illustrated with light hatching) is the high-cooling-need area, and a central area 22*b* (the area illustrated with dark hatching) is the low-cooling-need area.

The electrostatic electrode 23 is a flat mesh electrode or plate electrode and is capable of receiving a direct-current voltage. When a direct-current voltage is applied to the electrostatic electrode 23, the wafer W is electrostatically attracted to the wafer placement surface 22 (specifically, the upper surface of the seal band and the upper surfaces of the round small projections). When the application of the direct-current voltage is disabled, the attraction of the wafer W to the wafer placement surface 22 is disabled.

The FR placement surface 24 is provided around the wafer placement surface 22 and has an annular shape. The FR placement surface 24 is located at a lower level than the wafer placement surface 22. The FR placement surface 24 is designed to receive an annular focus ring 60. The focus ring 60 is made of, for example, Si. In an upper part of the inner sidewall of the focus ring 60 is provided a circumferential groove 62, with which the focus ring 60 avoids touching the wafer W. The outside diameter of the focus ring 60 is greater than the outside diameter of the ceramic plate 20 and the outside diameter of the cooling plate 30. Therefore, the focus ring 60 is to be placed on the FR placement surface 24 in such a manner as to extend outward beyond (overhang) the wafer placement table 10.

The cooling plate 30 is made of a material having a lower thermal conductivity than Al. Examples of such a material include a Ti-containing material. The cooling plate 30 has a refrigerant flow path 32, in which refrigerant is allowed to circulate. As illustrated in FIG. 3, in plan view, the refrigerant flow path 32 extends in a one-stroke pattern from one end (inlet 32in) thereof to the other end (outlet 32out) thereof in such a manner as to spread over the entirety of the ceramic plate 20. The refrigerant flow path 32 according to the present embodiment has a swirling shape in plan view. The cooling plate 30 configured as above may be obtained through, for example, diffusion bonding of a plurality of laminar members. The refrigerant is to be supplied from a refrigerant circulator, not illustrated, to the inlet 32in of the refrigerant flow path 32, flows through the refrigerant flow path 32, is discharged from the outlet 32out of the refrigerant flow path 32, and returns to the refrigerant circulator. The refrigerant circulator is capable of adjusting the refrigerant to have a desired temperature. The refrigerant may preferably be liquid and be electrically insulating. Examples of the electrically insulating liquid include fluorine-based inert liquid.

The cooling plate 30 is made of an electrically conductive material, which may preferably have a coefficient of thermal expansion that is close to that of the ceramic plate 20. If the ceramic plate 20 is made of alumina, the cooling plate 30 may preferably be made of pure Ti or an α-β Ti alloy. This is because the coefficient of thermal expansion of pure Ti or α-β Ti alloy is close to the coefficient of thermal expansion of alumina.

The joining layer 40 joins the lower surface of the ceramic plate 20 and the upper surface of the cooling plate 30 to each other. The joining layer 40 may be, for example, a metal layer made of solder or a metal brazing material, or may be a resin layer made of resin adhesive.

The refrigerant flow path 32 will now be described in detail. As illustrated in FIG. 2, the refrigerant flow path 32 includes a portion 32*x* and a portion 32*y*. The portion 32*x* corresponds to the outer peripheral area 22*a* (the high-cooling-need area) of the wafer placement surface 22. The portion 32*y* corresponds to the central area 22*b* (the low-cooling-need area). In the refrigerant flow path 32, the portion 32*x* corresponding to the outer peripheral area 22*a* is a portion of the refrigerant flow path 32 that extends from the inlet 32in to a middle position 32*mid*. In the refrigerant flow path 32, the portion 32*y* corresponding to the central area 22*b* is a portion of the refrigerant flow path 32 that extends from the middle position 32*mid* to the outlet 32out.

As illustrated in FIG. 4, letting the length between the upper surface of the refrigerant flow path 32 and the wafer placement surface 22 be D, a length Dx is shorter than a length Dy. The length Dx is for the portion 32*x* of the refrigerant flow path 32 that corresponds to the outer peripheral area 22*a* of the wafer placement surface 22. The length Dy is for the portion 32*y* of the refrigerant flow path 32 that corresponds to the central area 22*b*. The shorter the length D is, the higher the efficiency of heat exchange is between the wafer placement surface 22 and the refrigerant flowing in the refrigerant flow path 32.

Letting the flow-path cross-sectional area of the refrigerant flow path 32 be S, a flow-path cross-sectional area Sx is smaller than a flow-path cross-sectional area Sy. The flow-path cross-sectional area Sx is for the portion 32*x* corresponding to the outer peripheral area 22*a*. The flow-path cross-sectional area Sy is for the portion 32*y* corresponding to the central area 22*b*. The smaller the flow-path cross-sectional area S is, the faster the flow speed of the refrigerant flowing is in the refrigerant flow path 32 and the higher the cooling efficiency is. Note that the flow-path cross-sectional area S is the area of the cross section (the flow-path cross section) of the refrigerant flow path 32 that is taken in a plane perpendicular to the lengthwise direction of the refrigerant flow path 32.

Figure 5:
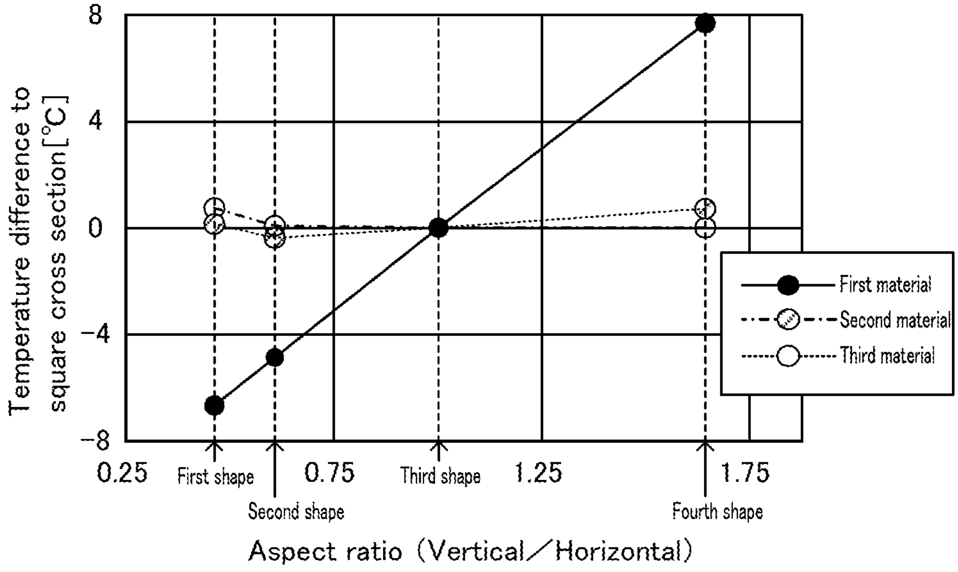
FIG. 5 is a graph illustrating the relationship between the aspect ratio of the flow-path cross section and a temperature characteristic.

Letting the aspect ratio (the ratio of the vertical length, H, to the horizontal length, W) of the flow-path cross section of the refrigerant flow path 32 be H/W, an aspect ratio Hx/Wx is smaller than an aspect ratio Hy/Wy. The aspect ratio Hx/Wx is for the portion 32*x* corresponding to the outer peripheral area 22*a*. The aspect ratio Hy/Wy is for the portion 32*y* corresponding to the central area 22*b*. If the cooling plate 30 is made of a material having a lower thermal conductivity than Al and if the refrigerant flow path 32 has a constant cross-sectional area, the cooling efficiency becomes higher as the aspect ratio H/W becomes smaller (this feature will be described separately below with reference to FIG. 5). Hence, in the refrigerant flow path 32, the portion 32*x* corresponding to the outer peripheral area 22*a* exerts higher cooling efficiency than the portion 32*y* corresponding to the central area 22*b*. In the present embodiment, Wx<Wy, and Hx<Hy.

Now, an exemplary usage of the wafer placement table 10 will be described. The wafer placement table 10 is fixed to the inside of a semiconductor-processing chamber, which is not illustrated. The focus ring 60 is placed on the FR placement surface 24, and a wafer W is placed on the wafer placement surface 22. In this state, a direct-current voltage is applied to the electrostatic electrode 23, whereby the wafer W is attracted to the wafer placement surface 22. Meanwhile, a heat conductive gas (such as He gas) is supplied to a gas passageway (a passageway extending from the lower surface of the cooling plate 30 to the wafer placement surface 22), which is not illustrated but is provided in the wafer placement table 10. Accordingly, the space enclosed by the lower surface of the wafer W and the seal band on the wafer placement surface 22 is filled with the gas. Thus, heat is to be conducted in a favorable manner between the wafer W and the wafer placement surface 22. Then, a predetermined vacuum atmosphere (or a reduced-pressure atmosphere) is produced inside the chamber. Furthermore, while a process gas is supplied from a showerhead provided at the ceiling of the chamber, an RF voltage is applied to the cooling plate 30. Accordingly, plasma is generated between the wafer W and the showerhead. With the plasma, CVD film deposition or etching is performed on the wafer W.

If the wafer W is processed with plasma as described above, the input of plasma heat is greater for the outer peripheral area of the wafer W than for the central area. Therefore, the outer peripheral area of the wafer W tends to have a higher temperature than the central area. Hence, to make the temperature of the wafer W uniform, the outer peripheral area 22*a* of the wafer placement surface 22 needs to be cooled more efficiently than the central area 22*b*. Considering such circumstances, in the present embodiment, the length D between the upper surface of the refrigerant flow path 32 and the wafer placement surface 22, the flow-path cross-sectional area S of the refrigerant flow path 32, and the aspect ratio H/W of the flow-path cross section of the refrigerant flow path 32 are adjusted as described above. Consequently, in the refrigerant flow path 32, the portion 32*x* corresponding to the outer peripheral area 22*a* exerts higher cooling efficiency than the portion 32*y* corresponding to the central area 22*b*.

In the wafer placement table 10 described above, the length D between the upper surface of the refrigerant flow path 32 and the wafer placement surface 22 is not constant and varies as being long in one part and short in another part. In the part where the length D is short, the cooling efficiency is higher than in the part where the length D is long. The flow-path cross-sectional area S of the refrigerant flow path 32 is not constant and varies as being small in one part and large in another part. In the part where the flow-path cross-sectional area S of the refrigerant flow path 32 is small, the flow speed is faster and the cooling efficiency is higher than in the part where the flow-path cross-sectional area S is large. The aspect ratio H/W defined as the ratio of the vertical length to the horizontal length of the flow-path cross section of the refrigerant flow path 32 is not constant and varies as being small in one part and large in another part. If the cooling plate 30 is made of a material having a lower thermal conductivity than Al and if the refrigerant flow path 32 has a constant cross-sectional area, the cooling efficiency becomes higher as the aspect ratio becomes smaller. The above means that, in the wafer placement table 10 including the cooling plate 30 made of a material having a lower thermal conductivity than Al, adjusting the length D between the upper surface of the refrigerant flow path 32 and the wafer placement surface 22, the flow-path cross-sectional area S of the refrigerant flow path 32, and the aspect ratio H/W of the flow-path cross section reduces the temperature nonuniformity at the wafer placement surface 22.

The cooling plate 30 may preferably have a thermal conductivity of 50 W/mK or lower. In such a case, if the refrigerant flow path 32 has a constant cross-sectional area, the cooling efficiency significantly becomes higher as the aspect ratio H/W becomes smaller. If the cooling plate 30 has a thermal conductivity of 5 to 20 W/mK, the effect produced in relation to the aspect ratio is more pronounced. For example, pure Ti has a thermal conductivity of 17 W/mK, and the α-β Ti alloy has a thermal conductivity of 7.5 W/mK.

The input of plasma heat to the wafer placement table 10 is, in general, greater for the outer peripheral area 22*a* of the wafer placement surface 22 than for the central area 22*b*. Considering such a situation, the length D, the flow-path cross-sectional area S, and the aspect ratio H/W are designed such that the efficiency of heat exchange in the outer peripheral area 22*a* of the wafer placement surface 22 is higher than the efficiency of heat exchange in the central area 22*b*. According to the present embodiment, in the outer peripheral area 22*a* of the wafer placement surface 22 of the wafer placement table 10, the length D is shorter, the flow-path cross-sectional area S is smaller, and the aspect ratio H/W is smaller than in the central area 22*b*. Thus, the cooling efficiency in the outer peripheral area 22*a* of the wafer placement surface 22 is made higher than in the central area 22*b*. Consequently, the temperature nonuniformity at the wafer placement surface 22 is reduced effectively.

The ceramic plate 20 has the annular focus-ring placement surface 24 provided around the wafer placement surface 22 and located at a lower level than the wafer placement surface 22. The focus-ring placement surface 24 is designed to receive the annular focus ring 60 whose outside diameter is greater than the outside diameter of the ceramic plate 20 and the outside diameter of the cooling plate 30. In such a case, the focus ring 60 extends outward beyond (overhangs) the wafer placement table 10. Therefore, the outer peripheral area 22*a* of the wafer placement surface 22 is more likely to have a high temperature. Hence, the application of the present invention provides a great significance.

A part of the refrigerant flow path 32 where the aspect ratio H/W is small may preferably have an aspect ratio H/W of 0.5 or smaller. Such a design further increases the cooling efficiency exerted in the part of the refrigerant flow path 32 where the aspect ratio H/W is small. In this case, a part of the refrigerant flow path 32 where the aspect ratio H/W is large may have an aspect ratio H/W of 1 or greater. Such a design increases the difference in the cooling efficiency between the part of the refrigerant flow path 32 where the aspect ratio H/W is small and the part of the refrigerant flow path 32 where the aspect ratio H/W is large.

The ceramic plate 20 may preferably be made of alumina, and the cooling plate 30 may preferably be made of Ti or a Ti alloy. The difference in thermal expansion between the ceramic plate 20 and the cooling plate 30 made of the above materials is small. Therefore, the warpage of the wafer placement table 10 is reduced.

Now, the result of an examination for finding the relationship between the thermal conductivity of the material for the cooling plate, the aspect ratio of the flow-path cross section, and the cooling efficiency will be described. The material for the cooling plate was varied among a first material (Ti, for example) having a thermal conductivity of 20 W/mK, a second material having a thermal conductivity of 100 W/mK, and a third material (Al, for example) having a thermal conductivity of 200 W/mK. The cross-sectional shape of the refrigerant flow path was defined as follows: while the cross-sectional area was made constant at 80 $cm^2$, the cross-sectional shape was varied among four rectangles (each being an oblong rectangle or a square) sized 6 mm in height by 13 mm in width (an aspect ratio of about 0.5: a first shape); 7 mm in height by 11.5 mm in width (an aspect ratio of about 0.6: a second shape); 9 mm in height by 9 mm in width (an aspect ratio of 1: a third shape); and 11.5 mm in height by 7 mm in width (an aspect ratio of about 1.6: a fourth shape). The above refrigerant flow paths were provided inside respective cooling plates such that the upper surfaces of the refrigerant flow paths were each located within a predetermined range of 10 mm or shorter from the heat-input part, and the respective surface temperatures were obtained. The results are graphed in FIG. 5. The vertical axis of the graph represents the temperature difference expressed with reference to the case of the refrigerant flow path having a square cross section (the aspect ratio of 1). The findings from the graph are as follows. In the case of the first material having a low thermal conductivity, if the cross-sectional area of the refrigerant flow path is constant, the cooling efficiency becomes higher as the aspect ratio becomes smaller, marking a particularly high cooling efficiency at an aspect ratio of 0.5 or smaller. In the cases of the second and third materials each having a high thermal conductivity, if the cross-sectional area of the refrigerant flow path is constant, the cooling efficiency is high regardless of the aspect ratio but is slightly reduced at an aspect ratio of 0.6 or smaller.

The present invention is not limited to the above embodiment in any way and can be embodied in various ways within the technical scope thereof, of course.

According to the above embodiment, in the outer peripheral area 22*a* of the wafer placement surface 22, the length D is shorter, the flow-path cross-sectional area S is smaller, and the aspect ratio H/W is smaller than in the central area 22*b*. However, the present invention is not particularly limited to such an embodiment. The size relationship between the length D, the flow-path cross-sectional area S, and the aspect ratio H/W may be designed in any way, as long as the efficiency of heat exchange in the outer peripheral area 22*a* of the wafer placement surface 22 is higher than the efficiency of heat exchange in the central area 22*b*. For example, as long as the efficiency of heat exchange in the outer peripheral area 22*a* of the wafer placement surface 22 is higher than the efficiency of heat exchange in the central area 22*b*, the outer peripheral area 22*a* of the wafer placement surface 22 may be designed such that the length D is shorter, the flow-path cross-sectional area S is smaller, and the aspect ratio H/W is greater than in the central area 22*b*; such that the length D is shorter, the flow-path cross-sectional area S is greater, and the aspect ratio H/W is smaller than in the central area 22*b*; or such that the length D is longer, the flow-path cross-sectional area S is smaller, and the aspect ratio H/W is smaller than in the central area 22*b*. Furthermore, as long as the efficiency of heat exchange in the outer peripheral area 22*a* of the wafer placement surface 22 is higher than the efficiency of heat exchange in the central area 22*b*, the outer peripheral area 22*a* of the wafer placement surface 22 may be designed such that the length D is shorter, the flow-path cross-sectional area S is greater, and the aspect ratio H/W is greater than in the central area 22*b*; such that the length D is longer, the flow-path cross-sectional area S is smaller, and the aspect ratio H/W is greater than in the central area 22*b*; or such that the length D is longer, the flow-path cross-sectional area S is greater, and the aspect ratio H/W is smaller than in the central area 22*b*.

The efficiency of heat exchange may be obtained as follows. First, a first chiller capable of causing the refrigerant to circulate while controlling the temperature of the refrigerant is connected to the inlet 32in and the outlet 32out of the refrigerant flow path 32. Then, a refrigerant having the same temperature as the room temperature (25° C., for example) is caused to circulate in the refrigerant flow path 32. Meanwhile, another refrigerant having a predetermined temperature (80 to 100° C., for example) is prepared with a second chiller. Then, using a valve, the refrigerant is switched from the one having the same temperature as the room temperature to the one having the predetermined temperature, whereby the refrigerant having the predetermined temperature is caused to circulate in the refrigerant flow path 32. At the elapse of a predetermined period of time (ten seconds, for example) after the switching of the refrigerant, the temperature distribution at the wafer placement surface 22 is measured. With reference to the temperature distribution, the rate of temperature rise (the amount of temperature rise per unit time (° C./second)) is calculated. The calculated rate of temperature rise is used as an index for the efficiency of heat exchange. For example, when the refrigerant in the wafer placement table 10 is switched from a refrigerant at 25° C. to a refrigerant at 80° C., the rate of temperature rise in the outer peripheral area 22*a* of the wafer placement surface 22 is 7.5° C./second or higher, whereas the rate of temperature rise in the central area 22*b* is 5° C./second or lower. This shows that the efficiency of heat exchange in the outer peripheral area 22*a* is higher than the efficiency of heat exchange in the central area 22*b*. Note that the rate of temperature rise at the boundary between the outer peripheral area 22*a* and the central area 22*b* is the mid value between the values for the respective areas.

According to the above embodiment, the high-cooling-need area is the outer peripheral area 22*a* of the wafer placement surface 22, and the low-cooling-need area is the central area 22*b* of the wafer placement surface 22. However, the present invention is not particularly limited to such an embodiment.

According to the above embodiment, the electrostatic electrode 23 is provided inside the ceramic plate 20 at such a position as to face the wafer placement surface 22. In addition, an FR attraction electrode for electrostatically attracting the focus ring 60 may be provided inside the ceramic plate 20 at such a position as to face the FR placement surface 24.

The above embodiment relates to an exemplary case where the ceramic plate 20 has the wafer placement surface 22 and the FR placement surface 24. However, the present invention is not particularly limited to such an embodiment. For example, the ceramic plate 20 may be a plate having the wafer placement surface 22 but no FR placement surface 24.

The above embodiment relates to an exemplary case where the outside diameter of the focus ring 60 is greater than the outside diameter of the wafer placement table 10 (the outside diameter of the ceramic plate 20 and the outside diameter of the cooling plate 30). However, the present invention is not particularly limited to such an embodiment. For example, the outside diameter of the focus ring 60 may be equal to the outside diameter of the wafer placement table 10.

According to the above embodiment, the refrigerant flow path 32 has a swirling shape in plan view. However, the present invention is not particularly limited to such an embodiment. For example, the refrigerant flow path 32 may have a zigzag shape in plan view.

The above embodiment relates to an exemplary case where the wafer placement table 10 includes the ceramic plate 20 provided thereinside with the electrostatic electrode 23. However, the present invention is not particularly limited to such an embodiment. For example, the ceramic plate 20 may be provided thereinside with a heater electrode (resistance heating element) or a plasma-generating electrode (RF electrode) in replacement of or in addition to the electrostatic electrode 23.

In the above embodiment, the wafer placement table 10 may have a plurality of lift pin holes each extending through the wafer placement table 10 from top to bottom. Such lift pin holes are holes intended to receive lift pins with which the wafer W is moved up and down relative to the wafer placement surface 22. In the plan view of the wafer placement surface 22, the plurality of lift pin holes are arranged, for example, at regular intervals along a circle concentric to the wafer placement surface 22.

Figure 6:
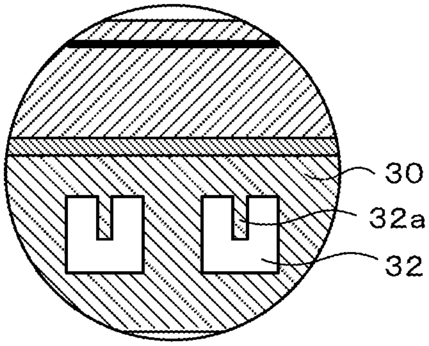
FIG. 6 is a sectional view of a refrigerant flow path 32 provided with a fin 32*a*.

In the above embodiment, as illustrated in FIG. 6, a fin 32*a* (a projection) may be provided at the ceiling of the refrigerant flow path 32. The fin 32*a* may extend in the direction of the refrigerant flow path 32 over the entirety or a part of the refrigerant flow path 32. The fin 32*a* may be one fin or two or more fins.

International Application No. PCT/JP2023/019273, filed on May 24, 2023, is incorporated herein by reference in its entirety.

What is claimed is:

1. A wafer placement table comprising:

a ceramic plate having a wafer placement surface on an upper surface;

a cooling plate provided on a lower surface of the ceramic plate; and a refrigerant flow path provided inside the cooling plate, an annular focus-ring placement surface provided around the wafer placement surface of the ceramic plate and located at a lower level than the wafer placement surface;

wherein the cooling plate is made of a material having a lower thermal conductivity than Al, wherein a length between an upper surface of the refrigerant flow path and the wafer placement surface is not constant and varies as being long in one part and short in another part, wherein a flow-path cross-sectional area of the refrigerant flow path is not constant and varies as being small in one part and large in another part, and wherein an aspect ratio defined as a ratio of a vertical length to a horizontal length of a flow-path cross section of the refrigerant flow path is not constant and varies as being small in one part and large in another part, and wherein the aspect ratio of the flow-path cross section of the refrigerant flow path in the portion corresponding to the focus-ring placement surface is smaller than the aspect ratio of the flow-path cross section of the refrigerant flow path in the portion corresponding to the central area of the wafer placement surface.

2. The wafer placement table according to claim 1, wherein the cooling plate has a thermal conductivity of 50 W/mK or lower.

3. The wafer placement table according to claim 1, wherein the length between the upper surface of the refrigerant flow path and the wafer placement surface, the flow-path cross-sectional area of the refrigerant flow path, and the aspect ratio of the flow-path cross section of the refrigerant flow path are designed such that an efficiency of heat exchange in an outer peripheral area of the wafer placement surface is higher than an efficiency of heat exchange in a central area of the wafer placement surface.

4. The wafer placement table according to claim 3, wherein, in the outer peripheral area of the wafer placement surface, the length between the upper surface of the refrigerant flow path and the wafer placement surface is shorter, the flow-path cross-sectional area of the refrigerant flow path is smaller, and the aspect ratio of the flow-path cross section of the refrigerant flow path is smaller than in the central area of the wafer placement surface.

5. The wafer placement table according to claim 3, wherein the focus-ring placement surface is designed to receive an annular focus ring whose outside diameter is greater than an outside diameter of the ceramic plate and an outside diameter of the cooling plate.

6. The wafer placement table according to claim 1, wherein a part of the refrigerant flow path where the aspect ratio is small has an aspect ratio of 0.5 or smaller.

7. The wafer placement table according to claim 6, wherein a part of the refrigerant flow path where the aspect ratio is large has an aspect ratio of 1 or greater.

8. The wafer placement table according to claim 1, wherein the ceramic plate is made of alumina, and wherein the cooling plate is made of Ti or a Ti alloy.

* * * * *